(12) United States Patent
Fujino et al.

(10) Patent No.: US 7,878,680 B2
(45) Date of Patent: Feb. 1, 2011

(54) LIGHT SOURCE MODULE, LIGHT SOURCE APPARATUS AND LIQUID CRYSTAL DISPLAY

(75) Inventors: Toyomi Fujino, Kanagawa (JP); Hiroyuki Fukasawa, Tokyo (JP); Masaru Fujii, Tokyo (JP)

(73) Assignee: Sony Corporation, Tokyo (JP)

( * ) Notice: Subject to any disclaimer, the term of this patent is extended or adjusted under 35 U.S.C. 154(b) by 664 days.

(21) Appl. No.: 11/775,938

(22) Filed: Jul. 11, 2007

(65) Prior Publication Data

US 2008/0143916 A1 Jun. 19, 2008

(30) Foreign Application Priority Data

Jul. 21, 2006 (JP) .......................... P2006-199437

(51) Int. Cl.
*F21V 21/00* (2006.01)
*F21V 29/00* (2006.01)

(52) U.S. Cl. ................. 362/231; 362/97.3; 362/294; 362/249.06; 362/373

(58) Field of Classification Search ........ 362/97.1–97.4, 362/294, 346, 235, 240, 241, 231, 373, 249.02, 362/249.06, 249.14; 349/61–64
See application file for complete search history.

(56) References Cited

U.S. PATENT DOCUMENTS

| 2002/0001192 | A1 | 1/2002 | Suehiro |
| 2003/0147228 | A1 | 8/2003 | Koike |
| 2005/0024868 | A1* | 2/2005 | Nagai et al. ............... 362/227 |
| 2005/0169007 | A1 | 8/2005 | Chou |
| 2006/0092346 | A1 | 5/2006 | Moon et al. |
| 2006/0103776 | A1 | 5/2006 | Park |
| 2006/0245204 | A1* | 11/2006 | Mizuta .................... 362/559 |

FOREIGN PATENT DOCUMENTS

| EP | 1675097 | 11/2006 |
| EP | 1741973 | 1/2007 |
| JP | 2003-092011 | 3/2003 |
| JP | 2003-110149 | 4/2003 |

(Continued)

OTHER PUBLICATIONS

Japanese Office Action issued on Feb. 26, 2008 in connection with Japanese Patent Application No. 2006-199437.

(Continued)

*Primary Examiner*—Thomas M Sember
(74) *Attorney, Agent, or Firm*—SNR Denton US LLP

(57) ABSTRACT

A light source module includes a light emitting diode and a wiring board. The light emitting diode (LED) chip group includes LED chips for red, green and blue colors. A plurality of the LED chip groups are mounted on the wiring board. A surface on one side of the wiring board is a device forming surface including the plurality of the LED chip groups, an external connecting terminal for leading out electrodes, and a wiring pattern for electrical connection between the LED chip groups and the external connecting terminal. A surface on the other side of the wiring board is a heat radiating surface which is thermally connected to the device forming surface and operative to radiate heat generated at the device forming surface to the exterior.

23 Claims, 13 Drawing Sheets

| | FOREIGN PATENT DOCUMENTS | |
|---|---|---|
| JP | 2006-147333 | 11/2004 |
| JP | 2005-122918 | 5/2005 |
| JP | 2005-285532 | 10/2005 |
| JP | 2005-35247 | 12/2005 |
| WO | 00/60406 | 10/2000 |
| WO | 2004/071141 | 8/2004 |
| WO | 2006-019085 | 2/2006 |
| WO | 2006/040937 | 4/2006 |

OTHER PUBLICATIONS

European Search Report in counterpart EP Application No. 07011596.9—2205 dated Sep. 6, 2007.

European Search Report dated Dec. 19, 2007.

* cited by examiner

LIGHT SOURCE MODULE, LIGHT SOURCE APPARATUS AND LIQUID CRYSTAL DISPLAY

CROSS REFERENCES TO RELATED APPLICATIONS

The present invention contains subject matter related to Japanese Patent Application JP 2006-199437 filed with the Japan Patent Office on Jul. 21, 2006, the entire contents of which being incorporated herein by reference.

BACKGROUND OF THE INVENTION

1. Field of the Invention

The present invention relates to a light source module, a light source apparatus and a liquid crystal display, using light emitting diodes (LEDs) as light sources.

2. Description of the Related Art

Liquid crystal displays (LCDs) are lower in power consumption than cathode ray tubes (CRTs), and can be reduced in size and in thickness. At present, liquid crystal displays in various sizes are widely used for apparatuses ranging from small ones such as portable phones, digital cameras, PDA (Personal Digital Assistants), etc. to large-sized liquid crystal TV sets.

The liquid crystal displays are classified into the transmission type, the reflection type and the like. Particularly, a transmission type liquid crystal display includes a backlight unit as an illuminating light source, in addition to a liquid crystal display panel having a liquid crystal layer sandwiched between a pair of transparent substrates. The backlight unit may be of the underneath type in which the light source is disposed underneath the liquid crystal display panel, or of the edge light type. For large-screen liquid crystal TV sets known as thin-type TV sets, the underneath-type backlight units are widely used.

As a light source for the backlight unit, CCFLs (Cold Cathode Fluorescent Lamps) have been being widely used. In recent years, LED backlight units having light emitting diodes (LEDs) for three primary colors, i.e., R (red), G (green) and B (blue) colors, as light sources are widely used so as to enhance the reproducibility of the display colors. The underneath-type LED backlight units include those in which LEDs for the RGB colors are arranged two-dimensionally in a plane to obtain white light (refer to Japanese Patent Laid-open No. 2005-352427 as referred to as Patent Document 1 hereinafter).

For example, Patent Document 1 discloses a light source module 42 in which, as shown in FIG. 13, a plurality of LED devices 40R, 40G, 40B for RGB colors are arranged in a predetermined order on the same axis line on a wiring board 41, and discloses a light source apparatus in which a plurality of such light source modules 42 are combined two-dimensionally to constitute an in-plane light source. The light source apparatus is used as a backlight apparatus for illuminating a liquid crystal display panel, from the back side, with white light obtained by operating the color LEDs to emit color rays and mixing the color rays.

SUMMARY OF THE INVENTION

However, in the light source apparatus described in Patent Document 1, the LED devices for the RGB colors are arranged in a row, so that the intervals between the LED devices for the colors are not constant; therefore, irregularities in the luminance of the white light obtained by mixing the color rays are comparatively large.

In addition, the light source apparatus described in Patent Document 1 has a lamp structure in which the LED devices for colors are packed or sub-mounted on a wiring board. Therefore, it is difficult to dispose the LED devices for colors close to each other and, therefore, it is difficult to obtain a uniform luminance.

Furthermore, in the light source apparatus described in Patent Document 1, since the LED devices for colors are arranged in a line, a narrowing of the device interval leads to a reduction in the pattern area on the wiring board, whereby the heat radiating property for the LED devices is lowered.

Thus, there is a need for a light source module, a light source apparatus, and a liquid crystal display, with which it is possible to obtain a more uniform luminance and to enhance the heat radiating property for LED devices.

According to an embodiment of the present invention, there is provided a light source module including: an LED chip group having LED chips for red, green and blue colors; and a wiring board on which a plurality of the LED chip groups are mounted. A surface on one side of the wiring board is a device forming surface including the plurality of the LED chip groups, an external connecting terminal for leading out electrodes, and a wiring pattern for electrical connection between the LED chip groups and the external connecting terminal. A surface on the other side of the wiring board is a heat radiating surface which is thermally connected to the device forming surface and operative to radiate heat generated at the device forming surface to the exterior.

In the light source module based on an embodiment of the present invention, bare chips of light emitting diodes (LED chips) are used as the LED devices, so that it is possible to reduce the layout intervals between the LEDs for the colors, to restrain the color difference and to enhance the uniformity of luminance. In this case, the LED chips for the RGB colors may be located respectively on the vertices of a triangle so that the intervals between the chips are substantially equal, whereby the mixing quality of the RGB color rays can be enhanced, and uniform white light can be obtained.

In addition, by combining a plurality of the light source modules in a two-dimensional manner, it is possible to obtain an in-plane light source for white light, which can be suitably used as a backlight unit in a liquid crystal display.

Furthermore, in the light source module based on an embodiment of the present invention, the surface on one side of the wiring board is made to be a device forming surface, and the surface on the other side of the wiring board is made to be a heat radiating surface. This configuration makes it possible to enhance the mounting efficiencies of the LED chips and the external connecting terminal on the wiring board, to enhance the degree of freedom in laying around the wiring pattern on the wiring board, simultaneously to enhance the heat radiating efficiency for the device forming surface, and to thereby prevent variations in chip characteristics, a lowering in device lifetime, and a rise in the temperature inside the backlight.

As above-mentioned, according to an embodiment of the present invention, it is possible to contrive simultaneously a more uniform luminance of white light and an enhanced heat radiating property. This makes it possible to fabricate a planar light source apparatus suitable for use as a backlight apparatus for a liquid crystal display, for example.

DETAILED DESCRIPTION OF THE PREFERRED EMBODIMENTS

Figure 1:
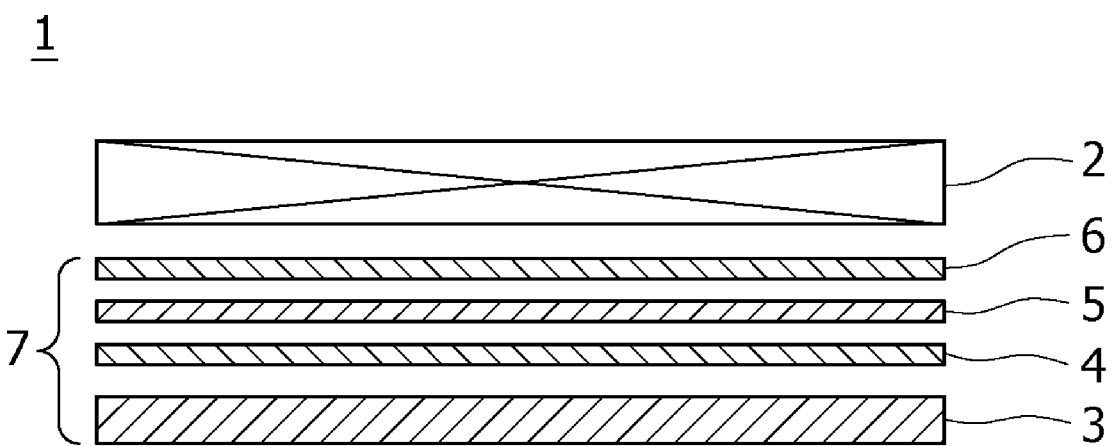
FIG. 1 is a schematic configuration view of a liquid crystal display to which a light source apparatus according to an embodiment of the present invention is applied.

Now, some embodiments of the present invention will be described below, referring to the drawings.

FIG. 1 is a side sectional view showing a general configuration of a liquid crystal display 1 according to an embodiment of the present invention. The liquid crystal display 1 shown in FIG. 1 includes a liquid crystal display panel 2, and a backlight apparatus 7 which is disposed on the back side (in FIG. 1, the lower side) of the liquid crystal display panel 2 and is operative to illuminate the back side of the liquid crystal display panel 2.

The backlight apparatus 7 has an underneath-type backlight unit (light source apparatus) 3 using light emitting diodes (LEDs) as light sources, and has a configuration in which a diffuser plate 4, a luminance enhancing sheet 5, and a polarized light separating element 6 are disposed in appropriate combination on the light outgoing surface side of the backlight unit 3.

The liquid crystal display panel 2 includes a pair of transparent substrates opposed to each other with a liquid crystal layer therebetween, a pair of polarizing plates disposed respectively on the outer sides of the transparent substrates, and the like. Incidentally, if necessary, an optical compensating film such as a phase difference plate is disposed between the transparent substrate and the polarizing plate. A transparent electrode film, an orienting film, a color filter and the like are provided on the inner side of the transparent substrate.

The diffuser plate 4 has the function of emitting light-source light diffusingly in a predetermined angular range. The luminance enhancing film 5 is composed, for example, of a prism sheet, and has the function of condensing the light-source light diffusedly emitted from the diffuser plate 4 and make it incident on the polarized light separating element 6. The polarized light separating element 6 transmits a certain linearly polarized light component (for example, P wave), and reflect other linearly polarized light component (for example, S wave). This ensures that only the certain polarized light is permitted to be incident on the liquid crystal display panel 2.

The polarized light outgoing from the polarized light separating element 6 is permitted to enter the liquid crystal layer through the polarizing plate having a transmission axis parallel to the polarization direction of the polarized light, in the liquid crystal display panel 2. Liquid crystal molecules constituting the liquid crystal layer are controlled in orientation by being voltage driven on the basis of each pixel region, so as to impart rotatory polarization to the incident polarized light. As a result, the light which passes through the color filter and through the polarizing plate on the front surface side of the liquid crystal display panel 2 and the light which does not pass are controlled on a pixel basis, whereby a color image is formed on the front surface of the liquid crystal display panel 2.

Now, details of the configuration of the backlight unit 3 as the light source apparatus based on the present invention will be described below.

Figure 2:
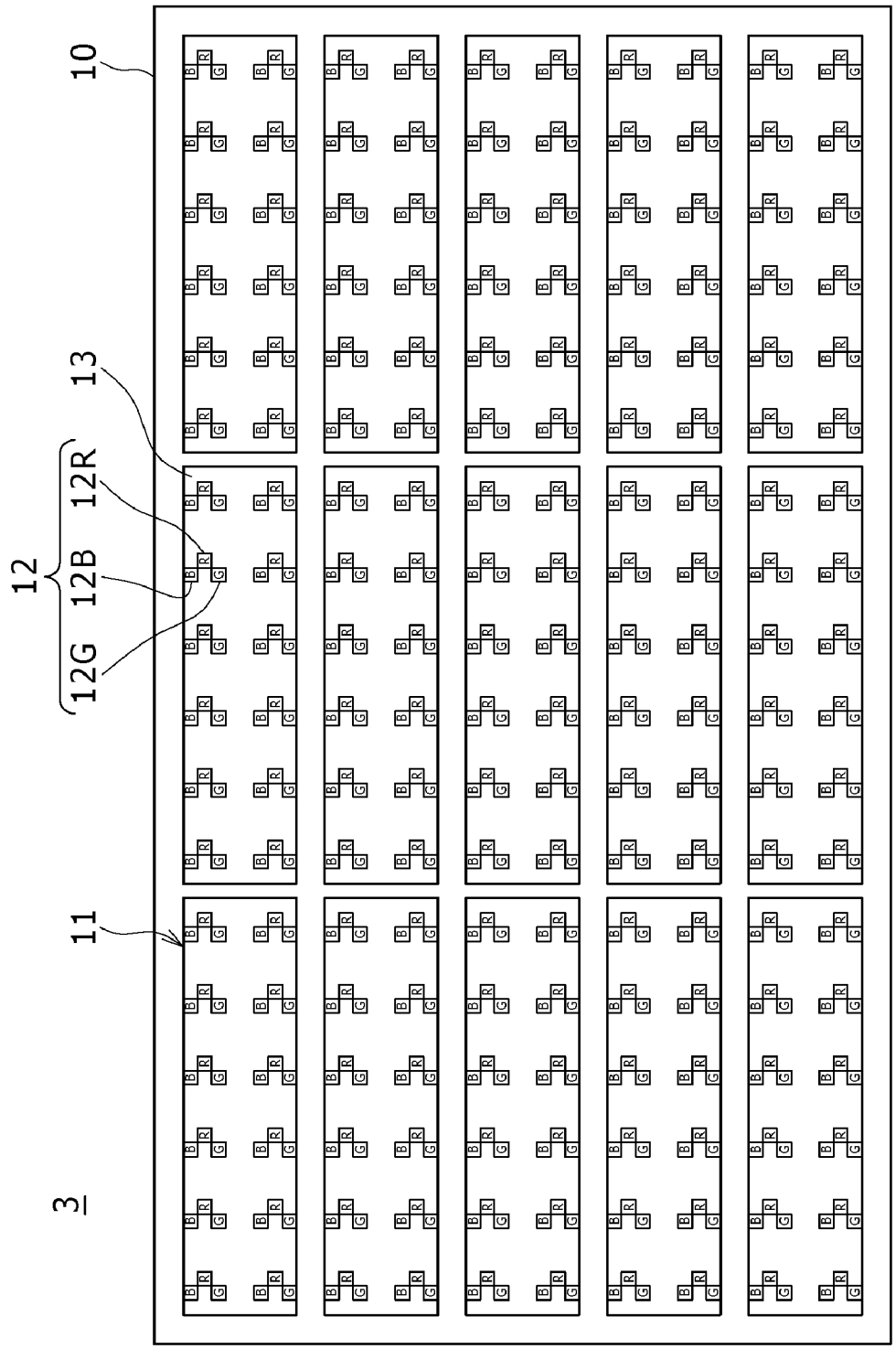
FIG. 2 is a plan view showing a general configuration of the light source apparatus according to the embodiment of the present invention.

FIG. 2 is a schematic plan view of the backlight unit 3. The backlight unit 3 includes a housing (back housing) 10 having reflective side walls, and the light source apparatus in which a plurality of light source modules 11 described later are integrally arranged in combination. In this embodiment, the housing 10 is formed from a metal in a rectangular shape in plan view, and a total of fifteen light source modules 11 are disposed, in five rows and three columns, in the inside of the housing 10.

Incidentally, the method of fixing each of the light source modules 11 to the housing 10 is not particularly limited; for example, such methods as screwing and fitting-type fixation may be used. In this embodiment, each light module 11 is fittedly fixed by engagement with fixing claws (omitted in the figure) erected on the housing 11, and the peripheral edges of the wiring board 13 are provided in parts thereof with engaging recesses 19 (FIG. 3) for engagement with the claws, at arbitrary positions and in a predetermined number. This permits each light source module 11 to be accurately mounted at a predetermined position in a one-stroke manner.

Figure 3:
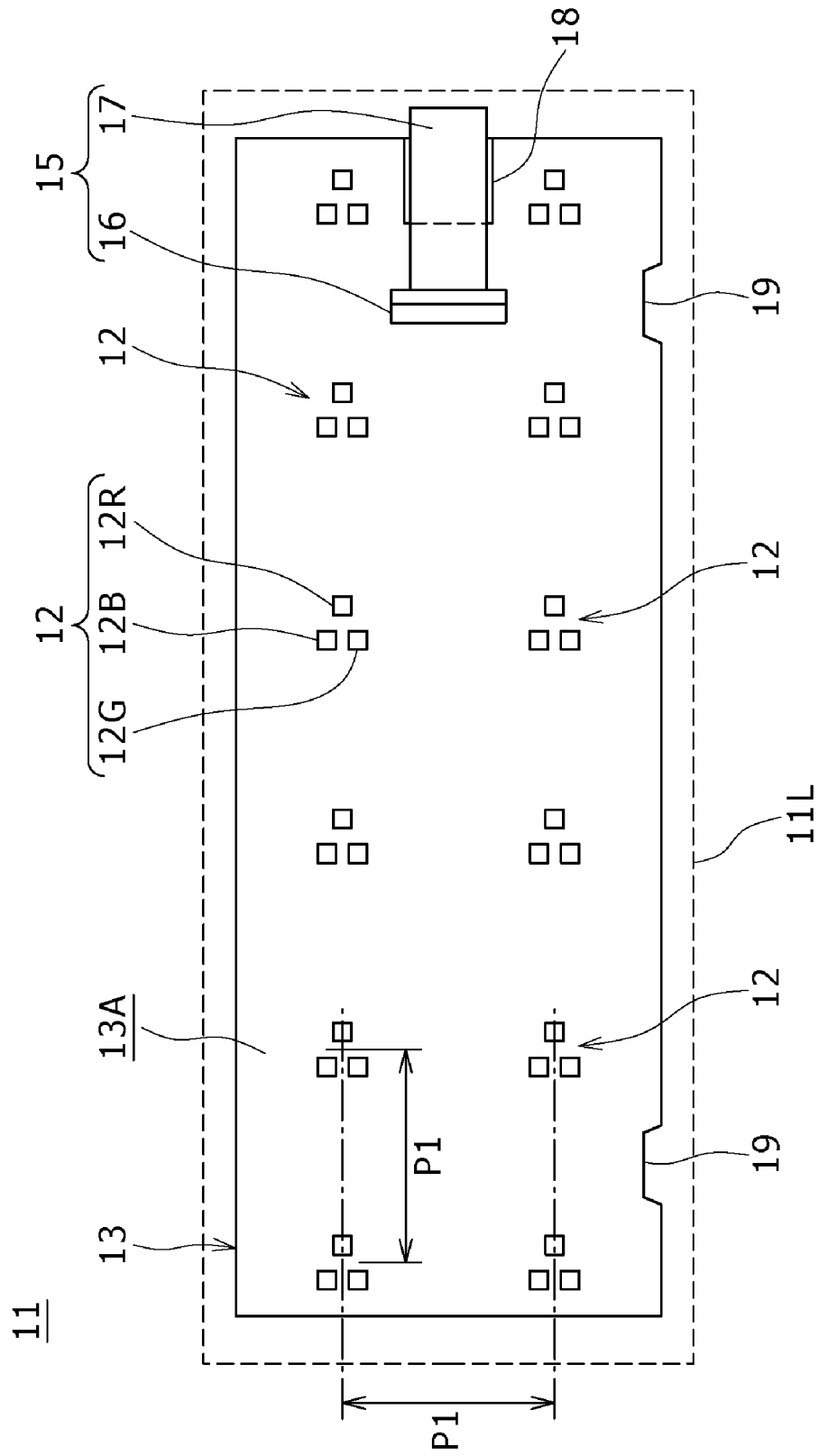
FIG. 3 is a plan view showing a general configuration of a device forming surface of a light source module according to an embodiment of the present invention.
Figure 4:
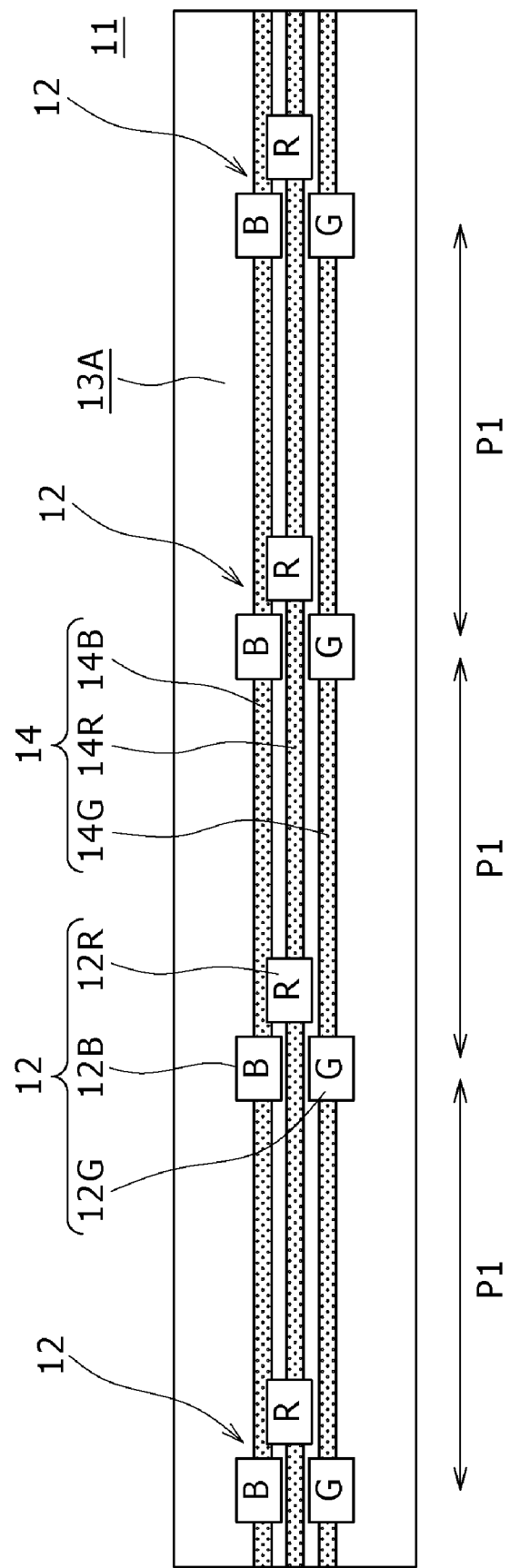
FIG. 4 is a plan view of an essential part showing the relationship between LED chips for RGB colors and a wiring pattern, in the light source module shown in FIG. 3.

FIG. 3 is a schematic plan view of the light source module 11. FIG. 4 is a plan view of an essential part of the light source module 11. The light source module 11 includes red LED chips 12R, green LED chips 12G and blue LED chips 12B, and a substantially rectangular wiring board 13 on which to mount the LED chips 12R, 12G and 12B for the red, green and blue colors.

The wiring board 13 is composed of a double side copper-clad laminate board in which the face-side copper layer and the back-side copper layer are connected to each other at arbitrary positions; however, a metal base board may also be used. The outer size of the wiring board 13 is determined according to the panel size of the liquid crystal display panel 2 and the like factors; in this embodiment, the wiring board 13 is 50 mm vertically and 169 mm horizontally (in the figure). In addition, the optical covering area 11L of the light source module 11 indicated by broken lines in FIG. 3 is 59.6 mm vertically and 178.8 mm horizontally (in the figure).

As shown in FIGS. 3 and 4, the surface on one side of the wiring board 13 is a device forming surface 13A on which to mount a plurality of LED chip groups 12. An external connecting terminal 15 for leading out electrodes and a wiring pattern 14 for electrical connection between the external connecting terminal 15 and the LED chip groups 12 are provided on the device forming surface 13A, in addition to the LED chip groups 12. The device forming surface 13A is colored, for example, in white so as to enhance light reflectivity thereof.

As shown in FIG. 3, the light source module 11 has a configuration in which a plurality of groups each composed of LED chips 12R, 12G and 12B for RGB colors (hereinafter referred to as the "LED chip group 12") are mounted at a regular interval P1 on the device forming surface 13A of the wiring board 13. In this embodiment, a total of twelve LED chip groups 12 are mounted on one wiring board 13, in two rows (with the row extending along the major edge direction of the wiring board 13) and in six columns (with the column extending along the minor edge direction of the wiring board 13).

Figure 5:
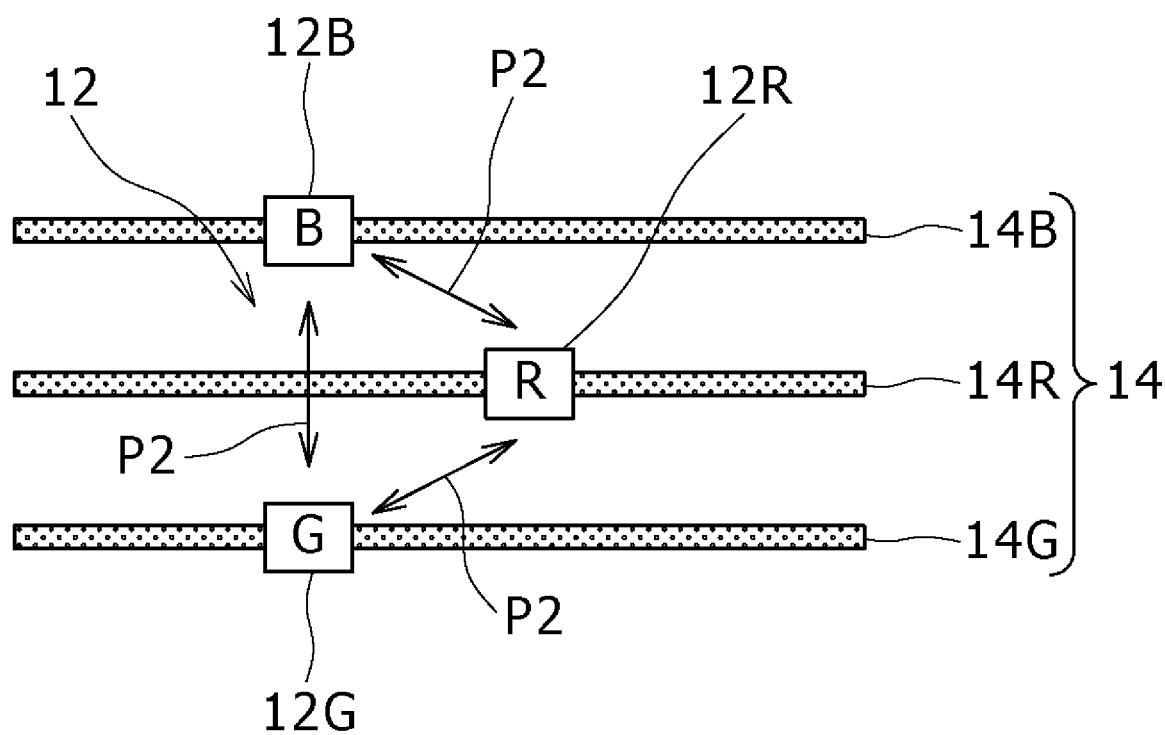
FIG. 5 is an enlarged view illustrating the positional relationships among the LED chips for RGB colors, in the light source module shown in FIG. 4.

FIG. 5 shows an example of layout of the LED chip groups 12. In this embodiment, the LED chips for colors in each group are mounted on the wiring board 13 so that they are located respectively on the vertices of a triangle and that the interval between the LED chips 12R and 12G, the interval between the LED chips 12G and 12B, and the interval between the LED chips 12B and 12R are substantially equal. More specifically, as shown in FIG. 5, the LED chips 12R, 12G, 12B for the RGB colors are located to constitute a regular triangle, whereby the chip intervals P2 between the LED chips are made equal.

Incidentally, in this embodiment, the layout interval P1 between the LED chip groups 12 is 29.8 mm, and the chip interval P2 between the LED chips 12R, 12G, 12B for the RGB colors is 4 mm.

The LED chips 12R, 12G, 12B for colors constituting the LED chip groups 12 are electrically connected to the wiring pattern 14 formed on the device forming surface 13A of the wiring board 13. The wiring pattern 14 includes three wiring patterns 14R, 14G, 14B formed correspondingly to the LED chips for the RGB colors, independently on a color basis. Specifically, the red LED chips 12R are mounted on the wiring pattern 14R, the green LED chips 12G are mounted on the wiring pattern 14B, and the blue LED chips 12B are mounted on the wiring pattern 14B.

In this embodiment, the wiring patterns 14R, 14G, 14B are formed in parallel to each other, with spacings therebetween. The wiring patterns 14R, 14G, 14B function not only as current input/output wirings for the LED chips 12R, 12G, 12B but also as heat radiating layers for releasing the heat generated on operations of the LED chips to the exterior.

As shown in FIG. 3, the external connecting terminal 15 includes a connector 16 mounted on the device forming surface 13A of the wiring board 13, and a flexible substrate 17 connected to the connector 16. The connector 16 is located at the center position of arbitrary four LED chip groups 12 located at the four corners of a tetragon. In addition, the wiring board 13 is provided with a cutout 18 for containing the flexible substrate 17 therein and leading out the flexible substrate 17 to the back surface (heat radiating surface) side of the wiring board 13. This ensures that the mixing of the color lights generated from the LED chip groups 12 is not hindered by the external connecting terminal 15.

Figure 6:
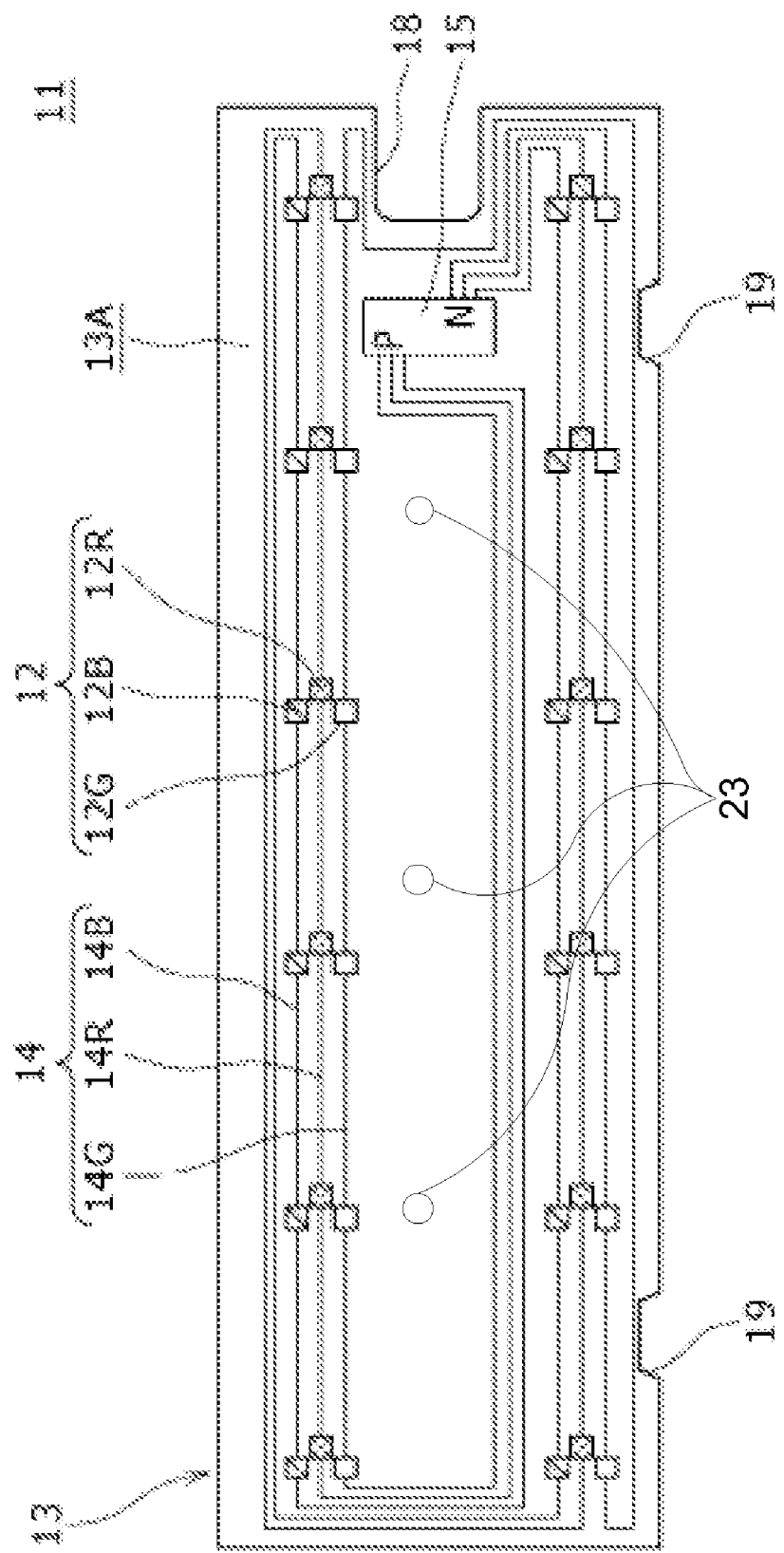
FIG. 6 is a circuit diagram showing an example of laying around the wiring pattern in the light source module shown in FIG. 3.

FIG. 6 shows a circuit example of the wiring pattern 14 on the device forming surface 13A of the wiring board 13. The wiring pattern 14 includes the three wiring patterns 14R, 14G, 14B laid around on the device forming surface 13A so as to connect the plurality of LED chip groups 12 in series on a color basis. In this embodiment, the LED chip groups 12 are mounted on the device forming surface 13A so that they are the same in layout relationships among the LED chips 12R, 12G, 12B for the RGB colors. Thus, the wiring pattern 14 is led out leftward in FIG. 6 from a positive electrode "P" of the external connecting terminal 15, is then bent back at 180° to the upper side, and connected to the LED chip group 12 at the left end on the upper row side. Then, the wiring pattern 14 connect all the LED chip groups 12 on the upper row side, and, thereafter, the wiring patterns 14R and 14B are led around counterclockwise along an outer peripheral edge of the wiring board 13 and connected to the LED chips 12R and 12B at the left end on the lower row side, while the wiring pattern 14G is led around clockwise along an outer peripheral edge of the wiring board 13 and connected to the LED chip 12G at the left end on the lower row side. Then, after connecting all the LED chip groups 12 on the lower row side, the wiring pattern 14 is connected to a negative electrode "N" of the external connecting terminal 15.

Thus, the wiring pattern 14 has the wiring patterns 14R, 14G, 14B laid around so as not to intersect each other, whereby jumper components are unnecessitated, and a reduction in parts cost can be contrived. In addition, since the LED chip groups 12 are mounted on the device forming surface 13A so that they are the same in layout relationships among the LED chips for the RGB colors, a reduction in luminance irregularities and a more uniform mixing of the RGB colors are promised. Further, since the wiring patterns 14R, 14G, 14B are laid around in the state of being branched from an intermediate portion, the laying-around efficiency of the wirings on the device forming layer 13A can be enhanced, and dielectric strength between the wirings can be easily secured.

Figure 7:
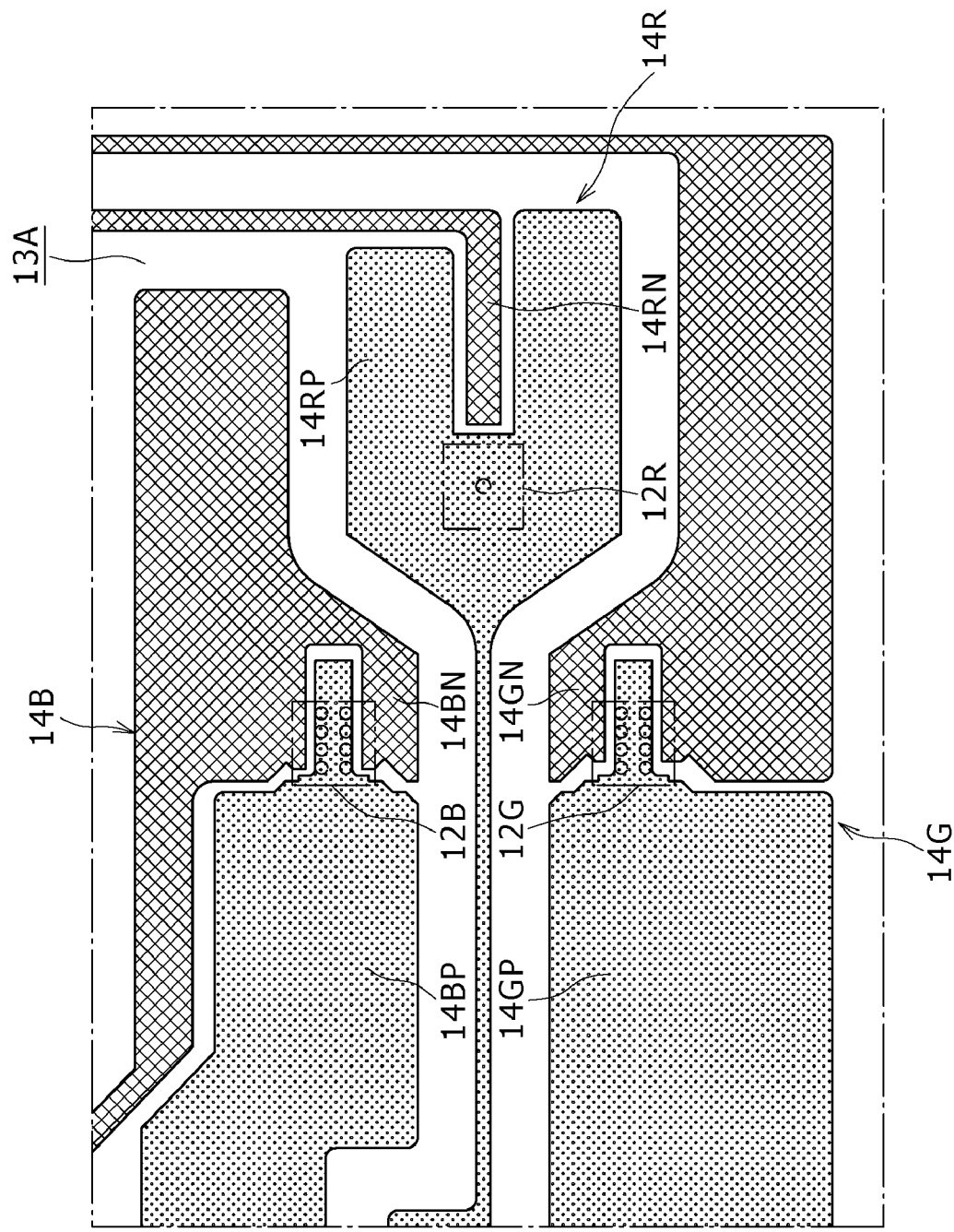
FIG. 7 is an enlarged view of an LED chip mounting region of the wiring pattern in the light source module shown in FIG. 3.

FIG. 7 shows an example of the configuration of land parts in the wiring pattern 14 with which the LED chips 12R, 12G, 12B are mounted. The wiring patterns 14R, 14G, 14B have paired structures composed of first land parts 14RP, 14GP and 14BP constituting the positive electrodes and second land parts 14RN, 14GN and 14BN constituting the negative electrodes, and the first and second land parts are electrically connected through the LED chips 12R, 12G, 12B. In the example shown, the red LED chip 14R is mounted on the first land part 14RP, and is connected to the second land part 14RN by wire bond junction. Besides, the green LED chip 12G and the blue LED chip 12B are mounted through flip chip mounting relative to the first and second land parts.

In this embodiment, as shown in FIG. 7, the wiring patterns 14R, 14G, 14B are greater in width in chip mounting regions composed of the first and second land parts than in wiring regions. In other words, the pattern width in the wiring regions of the wiring patterns is narrower than the LED chips, and the pattern width in the chip mounting regions of the wiring patterns is wider than the LED chips. This enhances the heat radiation efficiency of the LED chips 12R, 12G, 12B, thereby suppressing variations in the characteristics of the LED chips 12R, 12G, 12B.

In the next place, the surface (back surface) on the other side of the wiring board 13 is made to be a heat radiating surface 13B for radiating the heat generated at the device forming surface 13A to the exterior. The heat radiating surface 13B is thermally connected to the device forming surface 13A through interlayer connection parts (vias) 23. Incidentally, while on the heat radiating surface 13B a metal layer (copper foil layer) formed on the back surface of the wiring board 13 functions as a heat radiator, the metal layer may be made to function as a ground terminal for the device forming surface 13A.

Figure 8:
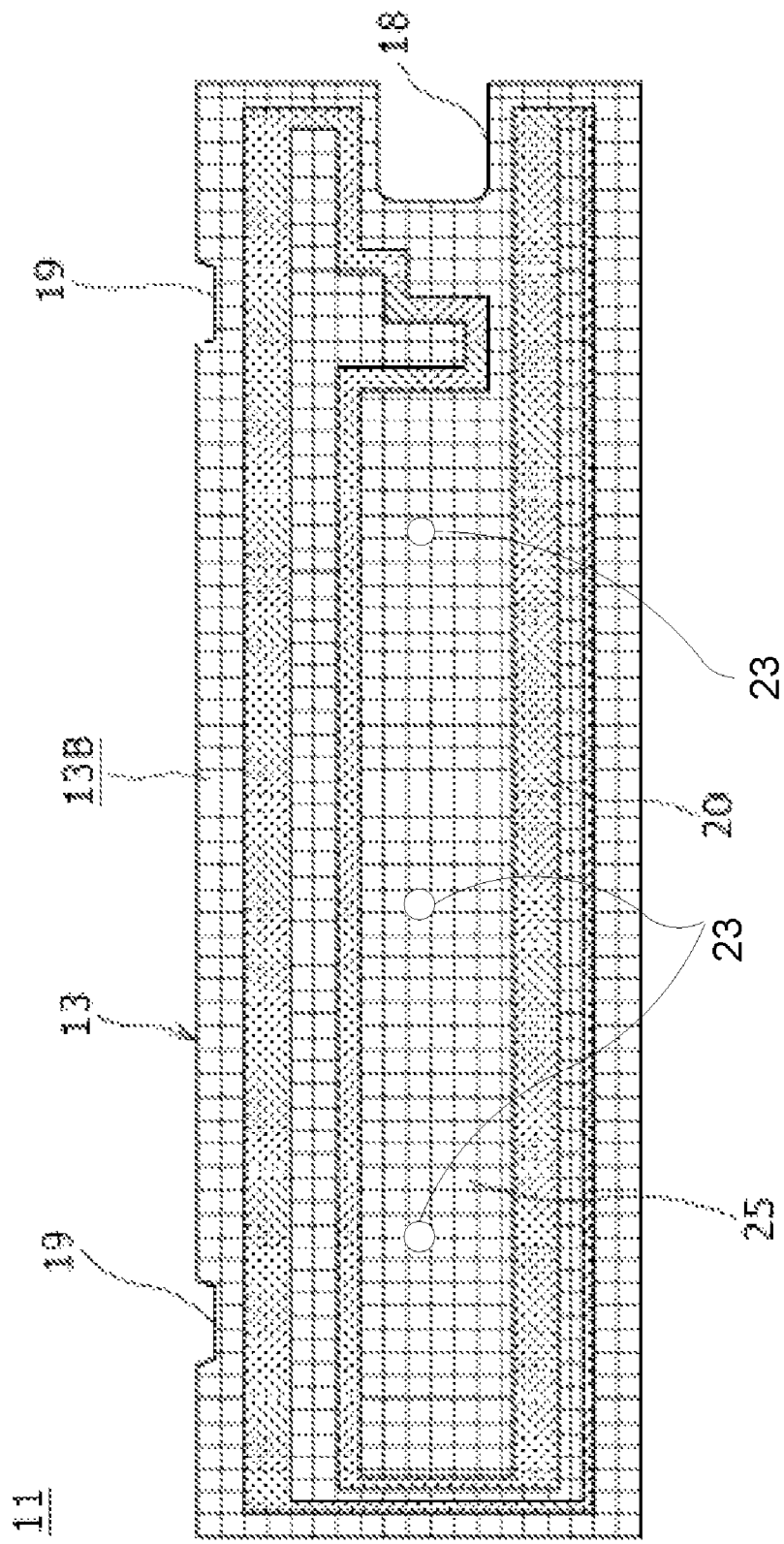
FIG. 8 is a plan view showing a general configuration of a heat radiating surface in a light source module according to an embodiment of the present invention.

The heat radiating surface 13B may be composed of a solid film of a metal layer, but, in this embodiment, the metal layer is patterned in a predetermined shape as shown in FIG. 8, for the purpose of preventing the wiring board 13 from warping. More specifically, the metal layer has a pattern (projection pattern) 20 obtained by projecting the wiring pattern 14 formed on the device forming surface 13A of the wiring board 13 onto the heat radiating surface 13B. In this projection pattern 20, in order to maximize the forming area of the metal layer, a gap corresponding to the space between the positive and negative electrodes in the land portions of the wiring pattern 14 is not provided in the metal layer, and, instead, the metal layer is formed to have a united land shape. Besides, on the heat radiating surface 13B, the metal layer is formed to have a lattice-like pattern (lattice pattern) 25 in the other region than the projection pattern 20. With the metal layer thus patterned in the projection pattern 20 and the lattice pattern 25, warping of the wiring board 13 can be prevented effectively.

The heat radiating surface 13B of the wiring board 13 is disposed in contact with the housing 10. The housing 10 is made of a metal such as aluminum and stainless steel, and the device forming surface 13A is cooled through the action of releasing heat to the housing 10. Though not shown, a cooling fan is disposed on the outside of the housing 10, and the housing 10 is normally air cooled by the cooling fan. Besides, in this embodiment, input/output wirings (other than a grounding wiring) for the LED chip groups 12 are not present on the heat radiating surface 13B of the wiring board 13, so that insulation failure of the wiring board 13 would not be generated due to contact with the housing 10.

Incidentally, a plurality of the wiring boards 13 are simultaneously produced from a large-area mother substrate, though not shown. In this case, an outer peripheral edge portion of the mother substrate supporting the wiring boars 13 is made to be a frame-formed region which is not converted into products, and, when the metal layers (copper foils) present on the face side and the back side of the frame-formed region are patterned in the same lattice shape as above, warping of the frame-formed region can be restrained. In this instance, when the lattice pitches of the metal layers are provided with a half-pitch difference between the face side and the back side of the frame-formed region, the preventive effect on the warping of the frame-formed region can be enhanced.

In this embodiment configured as above, the rays of light supplied from the LED chip groups 12 in the light source modules 11 and outgoing from the backlight unit 3 are incident on the liquid crystal display panel 2 through the diffuser plate 4, the luminance enhancing film 5 and the polarized light separating element 6, as white light obtained by mixing of RGB colors. The light source light thus incident on the liquid crystal display panel 2 is modulated on the basis of each pixel region in the liquid crystal display panel 2, to form a predetermined color image on the panel front surface.

In this embodiment, light emitting diode bare chips (LED chips) are used as the LED devices mounted in the light source module 11, so that the layout intervals among the LED chips 12R, 12G, 12B for the RGB colors can be reduced, whereby it is possible to restrain the color difference and enhance the uniformity of luminance.

In addition, since the plurality of LED chip groups 12 each having the LED chips for RGB colors located respectively on the vertices of a triangle are mounted at regular intervals on the wiring board 13 to constitute the light source module 11, an in-plane light source for white light with a predetermined size can be obtained by combining a plurality of such light source modules 11 two-dimensionally, and can be used suitably as a backlight unit for a liquid crystal display.

Further, in the light source module 11 according to this embodiment, the surface on one side of the wiring board 13 is made to be the device forming surface 13A, while the surface on the other side of the wiring board 13 is made to be the heat radiating surface 13B. This makes it possible to enhance the mounting efficiencies of the LED chips 12R, 12G, 12B and the external connecting terminal 15 on the wiring board 13, to enhance the degree of freedom in laying around the wiring pattern 14 on the wiring board 13, simultaneously to enhance the heat radiation efficiency for the device forming surface 13A, and to prevent variations in chip characteristics, a lowering in device lifetime, and a rise in the temperature inside the backlight.

Figure 9:
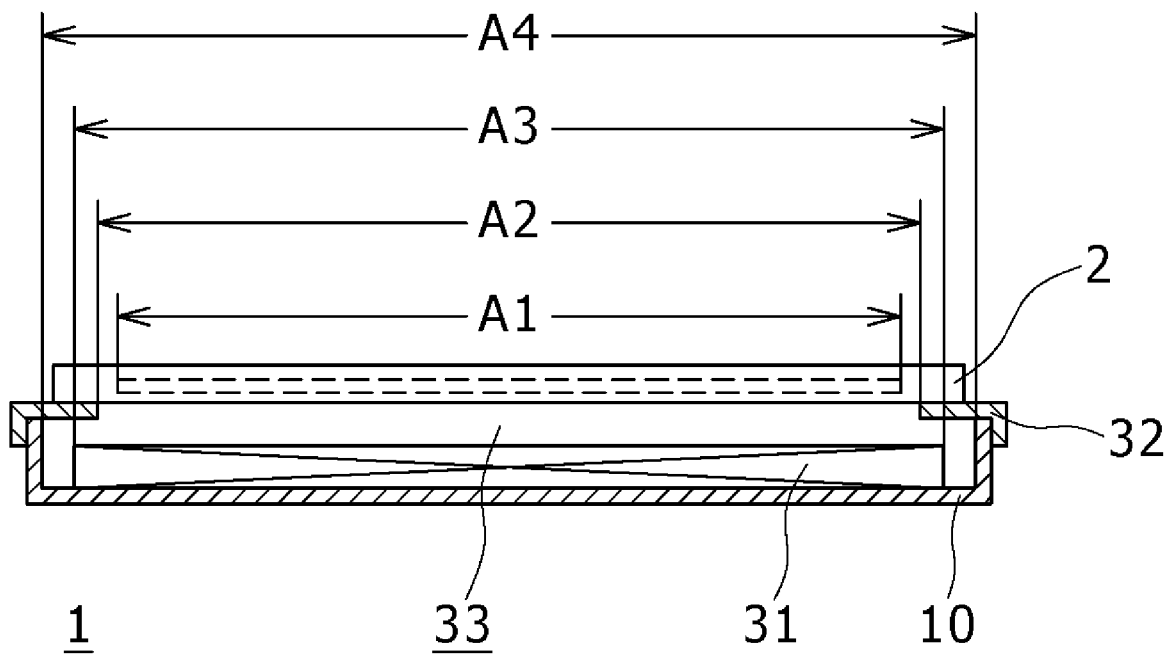
FIG. 9 is a side sectional view of an essential part of a liquid crystal display according to an embodiment of the present invention.

Furthermore, it has been confirmed that the liquid crystal display 1 schematically shown in FIG. 9 can exhibit desired optical characteristics (luminance distribution characteristic) in panel sizes of the liquid crystal display panel 2 of 32 inch, 40 inch, 46 inch, and 55 inch, in the case where the layout interval P1 of the LED chip group 12 is 29.8 mm, the chip interval P of the LED chips 12R, 12G, 12B for RGB colors is 4 mm, and the number of the LED chip groups 12 mounted per wiring board 13 is a total of 12, in two rows and in six columns.

In FIG. 9, symbol 10 denotes a back housing (housing), 31 denotes a light source apparatus in which a plurality of light source modules 11 are arranged, and 32 denotes a support housing for supporting the liquid crystal display panel 2 onto the back housing 10. The back housing 10 and the support housing 32 are opened (have apertures) on the side of the liquid crystal display panel 2, and the light from the light source apparatus 31 is introduced into the liquid crystal display panel 2 through these apertures. In this case, the components are so configured that the relationship of A1<A2<A3<A4 is satisfied, where A1 is the size of the pixel area in the liquid crystal display panel 2, A2 is the aperture size of the support housing 32, A3 is the size of the optical covering area of the light source apparatus 31, and A4 is the aperture size of the back housing 10.

Incidentally, a space part 33 formed between the light source apparatus 31 and the liquid crystal display panel 2 is a containing part for various optical sheet such as the diffuser plate, the luminance enhancing sheet, and the polarized light separating element, though not shown.

While some embodiments of the present invention have been described above, the present invention naturally is not limited to the embodiments, and various modifications are possible based on the technical thought of the invention.

Figure 10A:
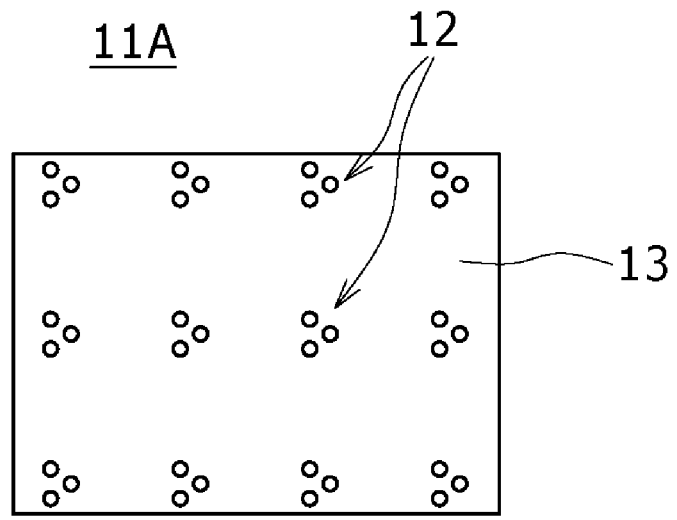
FIGS. 10A and 10B illustrate a modified example of the configuration of the wiring board in the light source module based on an embodiment of the present invention.
Figure 10B:
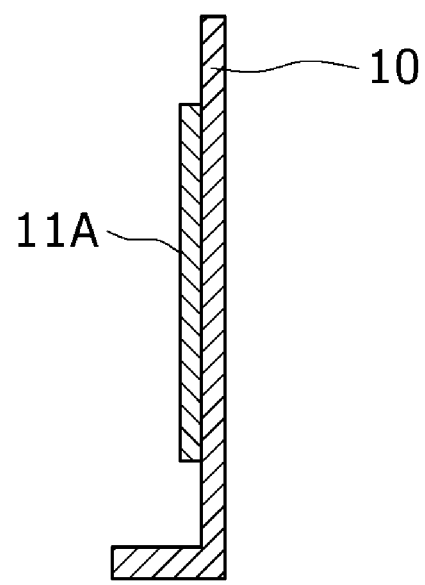

For example, the size of the light source module 11, the number of the LED chip groups 12 mounted, the mounting interval P1 thereof, the chip interval P2, and the number of the light source modules 11 combined, as mentioned in the embodiments above are mere examples and are not limitative; therefore, the values of these factors can be appropriately changed in accordance with the luminance characteristics and light source size which are desired. For instance, FIG. 10A shows a configuration example of a light source module 10A in which LED chip groups 12 are arranged in three rows and in four columns on a single wiring board 13. In addition, FIG. 10B is a schematic sectional view showing an example of mounting the light source module 11A to a housing 10.

While the shape of the wiring board 13 constituting the light source module 11 has been rectangular in the above embodiments, this is not limitative. As has been above-mentioned, a plurality of wiring boards 13 are produced simultaneously from a single mother substrate, so that taking of a larger number of products from the same mother substrate size is more advantageous on a production basis. It suffices for the wiring board to secure at least the regions for mounting or forming the LED chip groups 12, the wiring pattern 14 and the external connecting terminal 15. From this point of view, the wiring board 13 may be formed in the shape of the kana (Japanese alphabet) letter " 工 "

the kana letter " コ "

the kana letter " ヨ "

or the Chinese character " 王 "

whereby the number of wiring boards taken from a single mother substrate can be increased.

Figure 11A:
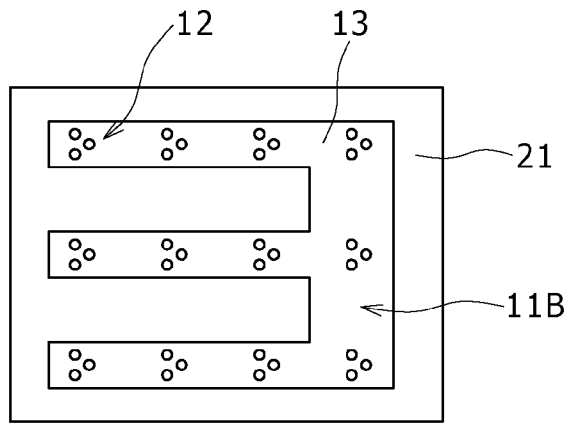
FIGS. 11A to 11C illustrate a modified example of the configuration of the light source module based on an embodiment of the present invention.
Figure 11B:
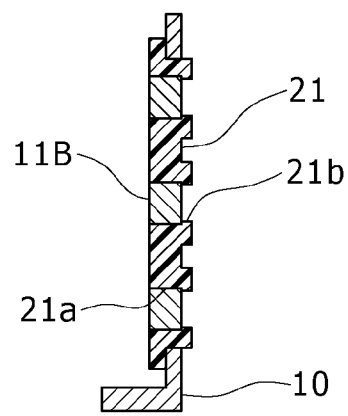

FIGS. 11A and 11B show a general configuration of a light source module 11B having a wiring board 13 in the shape of the kana letter " ヨ "

Figure 11C:
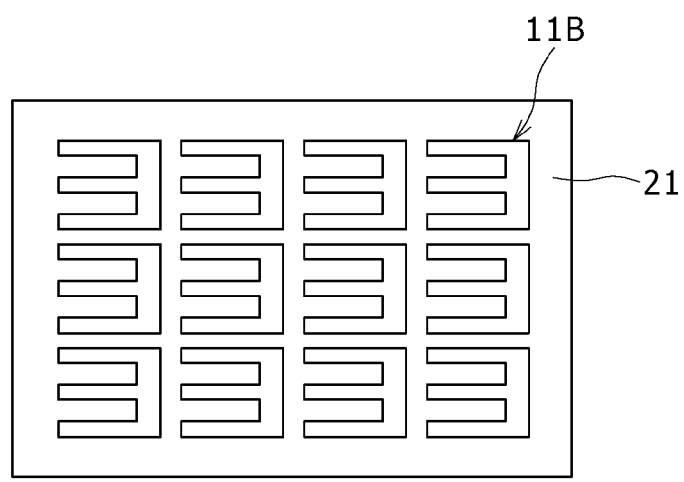

The wiring board 13 may be fixed directly to the housing 10. In the example shown, however, the wiring board 13 is fixed to the housing 10 through a support block 21 formed from a highly light reflective material, for example, a white molded resin. The support block 21 includes a containing part 21a with a shape corresponding to the outer shape (the shape of the kana letter " ヨ "

of the wiring board 13, and supports the back surface of the wiring board 13 at lock parts 21b. FIG. 11C is a schematic plan view of a light source apparatus configured by combining a plurality of such-shaped wiring boards 13. The support block 21 is so sized as to support the wiring boards 13 in common.

In the light source apparatus thus configured, the housing 10 supports the light source modules 11B in the state of being opened to the exterior on the back side (heat radiating surfaces) thereof, so that the cooling efficiency for the light source modules 11B can be enhanced.

Figure 12A:
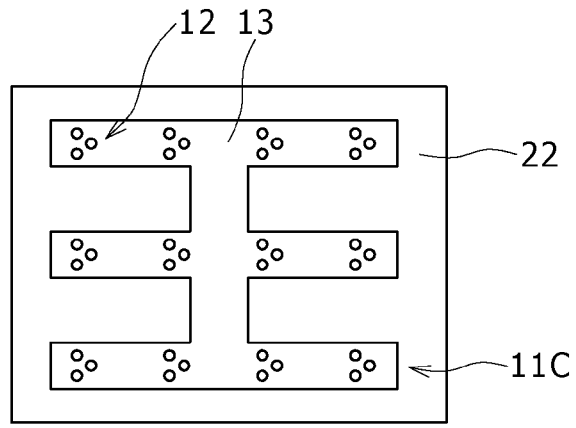
FIGS. 12A to 12C illustrate another modified example of the configuration of the light source module based on an embodiment of the present invention.
Figure 12B:
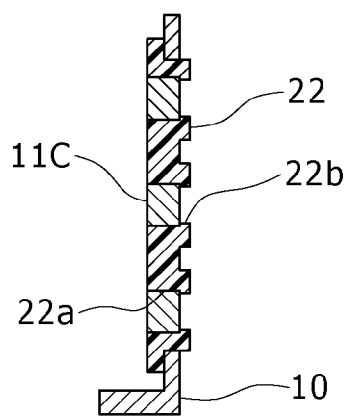

On the other hand, FIGS. 12A and 12B show a general configuration of a light source module 11C having a wiring board 13 in the shape of the Chinese character " 王 "

Figure 12C:
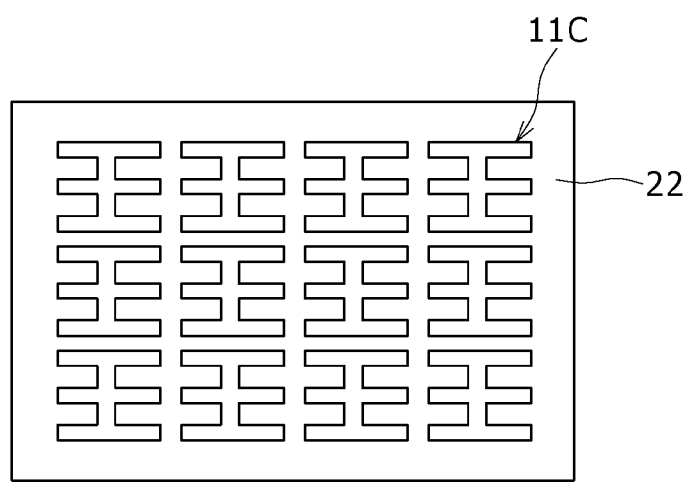
Figure 13:
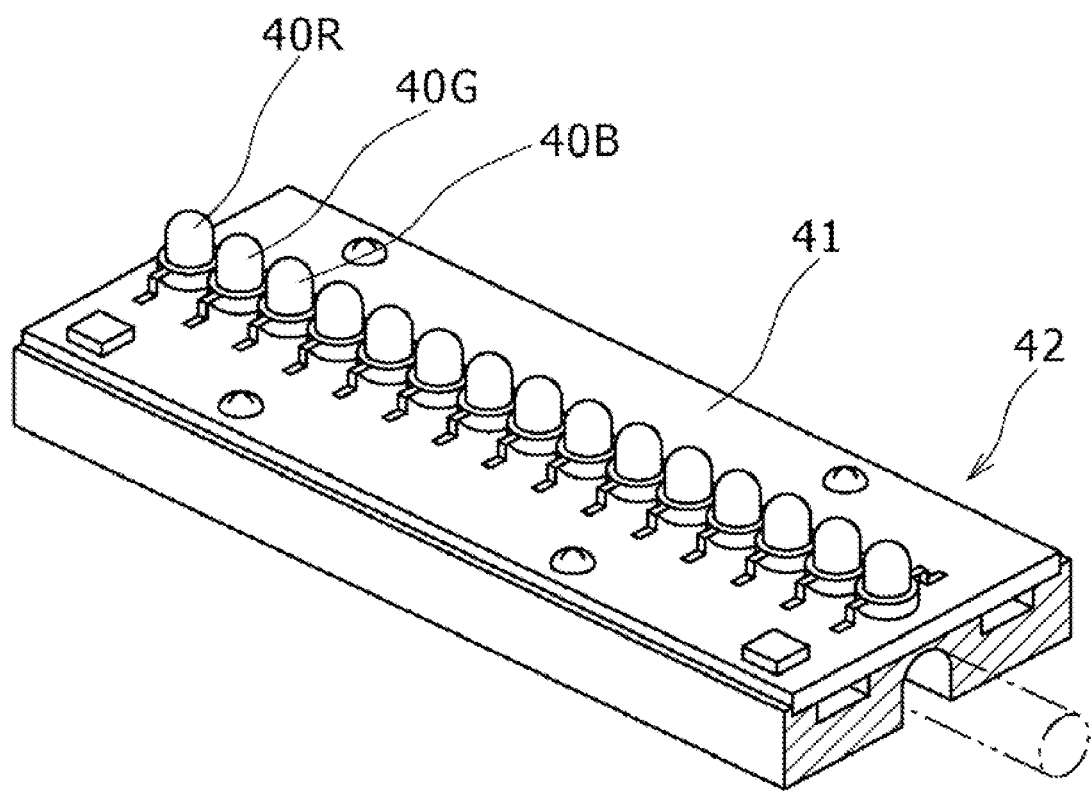
FIG. 13 is a perspective view of an essential part illustrating the configuration of an LED light source module according to an embodiment of the related art.

The wiring board 13 is fixed to a housing 10 through a support block 22. The support block 22 includes a containing part 22a with a shape corresponding to the outer shape (the shape of the Chinese character " 王 "

of the wiring board 13, and supports the back surface of the wiring board 13 at lock parts 22b. FIG. 12C is a schematic plan view of a light source apparatus configured by combining a plurality of such-shaped wiring boards 13. The support block 22 is so sized as to support the wiring boards 13 in common. This yields the same effects as above.

Furthermore, in the light modules described in the embodiments above, the LED chips 12R, 12G, 12B for RGB colors mounted on the device forming surface 13A of the wiring board 13 may be covered with a dome-shaped transparent resin serving as a lens layer. In this case, the lens layers may be formed on the basis of each LED chip or on the basis of a pair of LED chip group.

It should be understood by those skilled in the art that various modifications, combinations, sub-combinations and alterations may occur depending on design requirements and other factors insofar as they are within the scope of the appended claims or the equivalents thereof.

What is claimed is:

1. A light source module comprising:
    a light emitting diode (LED) chip group including LED chips for red, green and blue colors; and
    a wiring board on which a plurality of said LED chip groups are mounted,
    wherein,
    a surface on one side of said wiring board is a device forming surface including said plurality of said LED chip groups, an external connecting terminal for leading out electrodes, and a wiring pattern for electrical connection between said LED chip groups and said external connecting terminal; and
    a surface on the other side of said wiring board is a heat radiating surface which is thermally connected to said device forming surface through at least one interlayer connection part and is operative to radiate heat generated at said device forming surface to the exterior.

2. The light source module as set forth in claim 1, wherein each said LED chip group has said LED chips for said colors located respectively at the vertices of a triangle so that intervals between said LED chips for said colors are substantially equal.

3. The light source module as set forth in claim 1, wherein said LED chip groups are mounted on said device forming surface so that said LED chip groups are the same in layout relationship of said LED chips for said colors.

4. The light source module as set forth in claim 1, wherein said wiring pattern includes, laid around on said device forming surface, three wirings for connecting said plurality of said LED chip groups in series on the basis of each said color.

5. The light source module as set forth in claim 1, wherein said wiring pattern has said wirings laid around so as not to intersect each other.

6. The light source module as set forth in claim 1, wherein said wiring pattern has said wirings laid around in the state of being branched from an intermediate part on the basis of each said color.

7. The light source module as set forth in claim 1, wherein said wiring pattern is so formed that the pattern width in a wiring region is narrower than said LED chip.

8. The light source module as set forth in claim 1, wherein said wiring pattern is so formed that the pattern width in a chip mounting region is wider than said LED chip.

9. The light source module as set forth in claim 1, wherein said external connecting terminal is disposed at the center position of arbitrary four of said LED chip groups located respectively at the four corners of a tetragon, on said device forming surface.

10. The light source module as set forth in claim 1 wherein said external connecting terminal includes a connector mounted on said device forming surface, and a flexible substrate connected to said connector; and
    said wiring board is provided with a cutout for leading out said flexible substrate to the exterior.

11. The light source module as set forth in claim 1, wherein said device forming surface is colored in white.

12. The light source module as set forth in claim 1 wherein said heat radiating surface has a metal layer formed on said surface on said other side of said wiring board.

13. The light source module as set forth in claim 12 wherein said metal layer has a pattern shape obtained by projecting, onto said heat radiating surface, said wiring pattern formed on said device forming surface of said wiring board.

14. The light source module as set forth in claim 13 wherein said metal layer is patterned in a lattice form in a region different from the region of projection of said wiring pattern on said heat radiating surface.

15. The light source module as set forth in claim 13 wherein a region, corresponding to a land part where each said LED chip is mounted, of said region of projection of said wiring pattern has a shape in which a positive electrode and a negative electrode are united.

16. The light source module as set forth in claim 1 wherein six of said LED chip groups are arranged in the major edge direction of said wiring board.

17. A light source apparatus comprising a combination of a plurality of light source modules, each said light source module including:
   an LED chip group including LED chips for red, green and blue colors; and
   a wiring board on which a plurality of said LED chip groups are mounted,
   wherein,
      a surface on one side of said wiring board is a device forming surface including said plurality of said LED chip groups, an external connecting terminal for leading out electrodes, and
      a wiring pattern for electrical connection between said LED chip groups and said external connecting terminal; and
      a surface on the other side of said wiring board is a heat radiating surface which is thermally connected to said device forming surface through at least one interlayer connection part and is operative to radiate heat generated at said device forming surface to the exterior.

18. The light source apparatus as set forth in claim 17, wherein said light source modules are integrally arranged on a metallic housing.

19. The light source apparatus as set forth in claim 18, wherein said wiring board of each said light source module is provided in its peripheral edge part with an engaging recess to be engaged with a fixing claw provided on said metallic housing.

20. The light source apparatus as set forth in claim 18, wherein said wiring board of each said light source module is formed in the shape of the kana letter 'J", the kana letter '3", the kana letter "3" or the Chinese character 'z", and is supported on a common support block including a containing part having a shape corresponding to the outer shape of said wiring board.

21. The light source apparatus as set forth in claim 17, wherein said wiring board of each said light source module is opened to the exterior on the side of said surface on said other side.

22. A liquid crystal display comprising a liquid crystal display panel, and a backlight unit configured to illuminate said liquid crystal display panel from the back side, said backlight unit including a light source apparatus having a combination of a plurality of light source modules, each said light source module including:
   a LED chip group including LED chips for red, green and blue colors; and
   a wiring board on which a plurality of said LED chip groups are mounted, wherein,
      a surface on one side of said wiring board is a device forming surface having said plurality of said LED chip groups, an external connecting terminal for leading out electrodes, and
      a wiring pattern for electrical connection between said LED chip groups and said external connecting terminal; and
      a surface on the other side of said wiring board is a heat radiating surface which is thermally connected to said device forming surface through at least one interlayer connection part and is operative to radiate heat generated at said device forming surface to the exterior.

23. The liquid crystal display as set forth in claim 22, wherein said backlight unit includes:
   a metallic back housing containing said light source apparatus therein and opened on the side of said liquid crystal display panel; and
   a support housing disposed between said back housing and said liquid crystal display panel, supporting said liquid crystal display panel and opened on the side of said liquid crystal display panel, and
   the relationship of $A1<A2<A3<A4$ is satisfied, where $A1$ is the size of a pixel area in said liquid crystal display panel, $A2$ is the aperture size of said support housing, $A3$ is the size of an optical cover area of said light source apparatus, and $A4$ is the aperture size of said back housing.

* * * * *